(12) United States Patent
Anderson et al.

(10) Patent No.: US 6,228,748 B1
(45) Date of Patent: May 8, 2001

(54) USE OF A GETTER LAYER TO IMPROVE METAL TO METAL CONTACT RESISTANCE AT LOW RADIO FREQUENCY POWER

(75) Inventors: Steven M. Anderson; Sundar S. Chetlur, both of Kissmmee, FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/370,963

(22) Filed: Aug. 10, 1999

Related U.S. Application Data

(62) Division of application No. 08/946,413, filed on Oct. 7, 1997, now Pat. No. 5,989,984.

(51) Int. Cl.$^7$ .................................................. H01L 21/322
(52) U.S. Cl. ........................ 438/476; 438/143; 438/471; 438/473; 438/402
(58) Field of Search ..................... 438/143, 471, 438/473, 476, 402, 310

(56) References Cited

U.S. PATENT DOCUMENTS 5,680,282 * 10/1997 Albert et al. ........................ 360/113
5,994,206 * 11/1999 Gupta et al. ........................ 438/476

FOREIGN PATENT DOCUMENTS

680077 * 2/1995 (EP) .

* cited by examiner

Primary Examiner—Trung Dang

(57) ABSTRACT

The present invention provides a method of using a getter layer on a semiconductor substrate having a first metal stack formed thereon to improve metal to metal contact resistance. The method comprises the steps of forming a getter layer, which may be titanium, on the first metal stack, wherein the getter layer has a higher affinity for oxygen or a higher getter capability than the first metal stack, substantially removing the getter layer by exposing the getter layer to radiation, and forming a second metal stack, which in an advantageous embodiment may also be titanium, on the first metal stack.

12 Claims, 3 Drawing Sheets

USE OF A GETTER LAYER TO IMPROVE METAL TO METAL CONTACT RESISTANCE AT LOW RADIO FREQUENCY POWER

TECHNICAL FIELD OF THE INVENTION

This application is a Divisional of prior application Ser. No. 08/946,413 filed on Oct. 7, 1997, now U.S. Pat. No. 5,989,984, to Steven M. Anderson, et al. The above-listed application is commonly assigned with the present invention and is incorporated herein by reference as if reproduced herein in its entirety under Rule 1.53(b).

The present invention is directed, in general, to wafer fabrication and, more specifically, to a method of using a getter layer to improve metal to metal contact resistance.

BACKGROUND OF THE INVENTION

In the evolution of integrated circuits (ICs), the maximum number of devices per chip has steadily increased. The functional density (the number of interconnected devices per chip area) is dependent on how effectively these devices can be interconnected. As the number of devices that can be interconnected on the chip surface is limited, multilevel interconnection system have been employed to continually increase the functional density. Patterned aluminum thin films -are the most widely used interconnect structures in the manufacture of silicon ICs. Aluminum, however, oxidizes in ambient temperature and the resultant aluminum oxide acts as an insulator, increasing the contact resistance ($R_c$) when another metal layer is deposited. Similarly, contaminants deposited in the contact openings and vias from prior processes also contribute to increasing the $R_c$ when additional metal layers are added. With the ever-increasing layers, the $R_c$ accumulates and may affect the performance of the Ics. To alleviate the problems associated with the metal/metal contacts, back-sputtering is commonly used to remove residual oxides and contaminants formed and deposited on the contact metal surface resulting from previous fabrication processes.

As is well known, sputtering is a physical vapor deposition (PVD) mechanism that involves ionization of argon gas at a low pressure through the use of an electric field. Positive argon ions are accelerated into a negatively charged plate called the target. When these ions strike the target plate, atoms of the target material are sputtered off and then recondense on ambient surfaces to form thin films. Other basic modes of sputtering includes DC magnetron, RF magnetron, RF diode and RF triode. The DC magnetron mode of sputtering has been the most popular method of depositing aluminum since the late 1970's. However, by using RF power instead of DC, target materials that are not conductors may be deposited. RF energy is applied to the back surface of the target and is capacitively coupled to the front surface. The difference in mobility between the electrons and ions in the RF formed plasma causes the surface of the insulating target to acquire a net negative charge resulting in a large -vc self bias voltage. The magnitude of this bias increases with the in/out RF power. Positively charged argon ions in the plasma are accelerated to the surface of the target causing sputtering to occur.

In the back-sputtering process, the silicon wafer acts as the target and is bombarded with argon ions and these ions sputter any insulating layers that are present on the metal surface. The process removes metal oxides such as aluminum oxides or other contaminants, such as etch polymer atoms, leaving a "clean" metal surface for subsequent metal deposition. Previously, with technologies larger than 0.5 μm, a back-sputter process of 250 W was used to remove native oxides. However, as technologies shrink and gate oxides become thinner, larger wattages are necessary to remove the oxides. Unfortunatley, these high power processes can cause gate oxide damage and thus a lower RF back-sputter power is preferred. Moreover, as feature sizes are scaled into the half and sub-half micron regime, the aspect ratio of the contact opening or via also increases. In order for the interlevel parasitic capacitance of the interconnections to the underlying and overlying metallization lines to be maintained, or even reduced, the thickness of the dielectric layers in which the contact openings or vias are formed may not be decreased. Therefore, in technologies less than 0.5 μm, there is a substantial decrease in the width of the contact opening or via, while its depth stays essentially the same, resulting in a lager aspect ratio and a much narrower contact opening or via.

With the current 0.5 μm and 0.35 μm CMOS processes, a lower back-sputter power of 250 W does not adequately reduce the metal-to-metal contact resistance. The 250 W RF power is insufficient because of the larger aspect ratio of the contact openings or vias. A common solution used to improve the contact resistance is to increase the RF power during the back-sputtering process to overcome the larger depth of the contact openings or vias. To obtain comparable results with the prior 250 W RF back-sputtering process, the RF power has to be increased to about 500 W. As mentioned earlier, increasing the RF power, however, results in the semiconductor devices being exposed to an increased plasma damage. With the current trend of reducing the width and thickness of the gate oxides, the failures due to the higher plasma energy will increase, resulting in lower yields and reduced product reliability.

Therefore, there is a need in the art for improved methods and processes for the removal of oxides and contaminants at reduced RF power.

SUMMARY OF THE INVENTION

To address the deficiencies of prior art methods, the present invention provides method of using a getter layer on a semiconductor substrate having a first metal stack formed thereon to improve metal to metal contact resistance. The method comprises the steps of forming a getter layer, which may be titanium, on the first metal stack, wherein the getter layer has a higher affinity for oxygen or a high gettering capability than the first metal stack, substantially removing the getter layer by exposing the getter layer to radiation, and forming a second metal stack, which in an advantageous embodiment may also be titanium, on the first metal stack.

In one embodiment, the step of forming the getter layer includes the step of sputtering the getter layer onto the first metal stack.

In another embodiment, the step of substantially removing includes the step of removing the getter layer with a radio frequency (RF) source. In one aspect of this particular embodiment, the wattage of the radio frequency (RF) source does not exceed about 250 watts. However, other higher or lower wattage may be applicable, depending on the particular application.

In yet another embodiment, the step of forming the getter layer includes the step of the getter layer binding with impurities, such as oxide contaminants, located on said first metal stack.

In another embodiment, a dielectric layer that has an opening formed therein is formed over the first metal stack and the step of forming the getter layer includes the step of forming the getter layer within the opening to contact the first metal stack.

The step of forming the getter layer may include the step of forming the getter layer to a thickness ranging from about 6 nm to about 15 nm. Additionally, the step of forming the getter layer may include forming the getter layer at a temperature of about 375° C. and 3.0 milliTorr of pressure with a total argon flow rate of about 40 standard cubic centimeters per minute. In one advantageous embodiment, the agron flow rate comprises a module agron flow rate of about 28 standard cubic centimeters per minute and a backside argon flow rate of about 12 standard cubic centimeters per minute.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
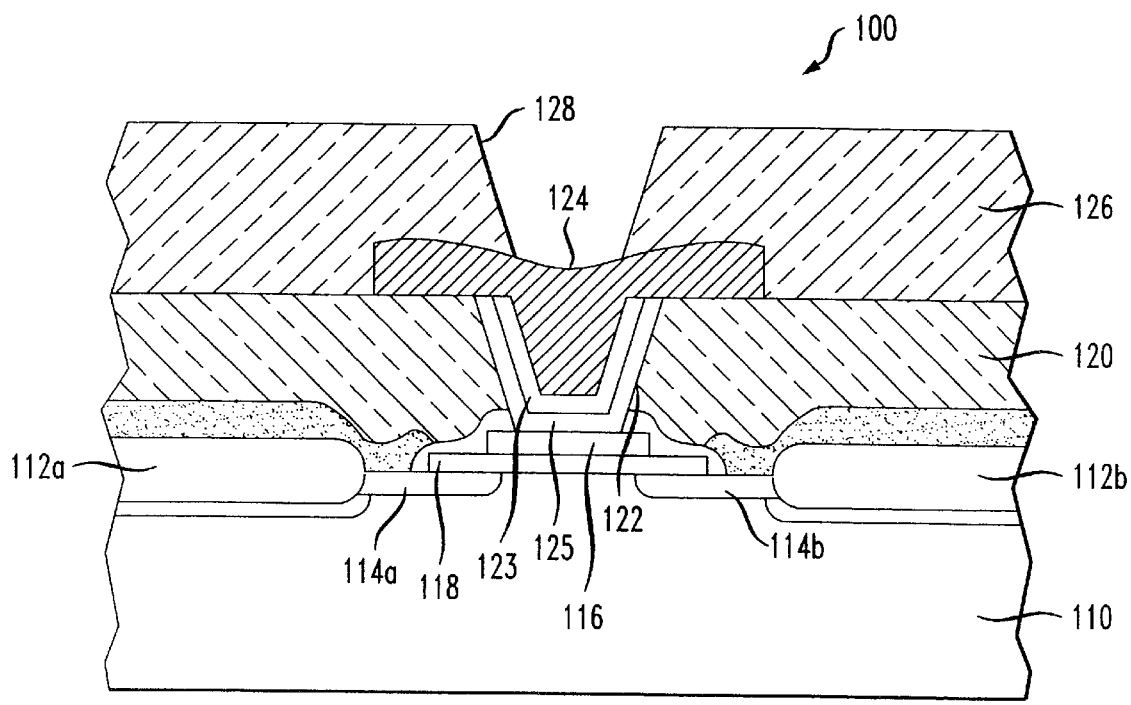
FIG. 1 illustrates an exemplary schematic cross-section of a typical metal oxide semiconductor (MOS) device.

Referring initially to FIG. 1, there is illustrated an exemplary schematic cross-section of a typical metal oxide semiconductor (MOS) device 100. As illustrated in FIG. 1, the semiconductor 100 includes a substrate 110, which may be formed from materials such as silicon, germanium, germanium arsenide or other materials known to those skilled in the art. The substrate 110 will typically include field oxide regions 112a, 112b and doped source and drain regions 114a, 114b, both of which are formed by conventional processes. A gate 116 positioned on a gate oxide 118 may also be formed on the substrate 110. Both the gate 116 and the gate oxide 118 are also formed by conventional processes. Deposited over the gate 116 and the substrate 110, is a dielectric layer 120. In advantageous embodiments, the dielectric layer 120 is deposited by conventional process using well known materials, such as tetraethyl orthosilicate (TEOS). The dielectric layer 120 may have a contact opening 122 formed therein over the gate 116. In typical embodiments, the contact opening 122 may have a barrier layer, such as a titanium nitride layer 123 deposited over a titanium layer 125. An interconnect metal 124, such as aluminum, may be deposited in the contact opening to provide the gate's 116 electrical connection to other portions of the semiconductor 110.

Continuing to refer to FIG. 1, the semiconductor 110 may further include a second dielectric layer 126 that is deposited over the interconnect metal 124. By way of conventional processes, a via 128 is formed in the second dielectric layer 126. Contaminants, such as oxides from previous fabrication processes, may accumulate in the via 128. In such instances, the semiconductor device 110 would be typically subjected to a radio frequency (RF) sputtering process that would clean the contaminants from the device to provide a clean surface for the subsequent metal deposition.

When MOS technologies were larger than the present day 0.5 μm, the aspect ratio of the opening was such that low wattage, e.g., around 250 watts of power, could be used to clean the device. However, as the width of the contact openings and vias have decreased, there has been an increase in the aspect ratio. Due to this increased aspect ratio a larger RF power is required to clean the impurities or contaminants from the relatively deep and narrow contact opening or via. As previously explained above, the increased RF power can be detrimental to the device and may cause plasma damage, which in turn, can affect the reliability of the semiconductor device 110.

Figure 2:
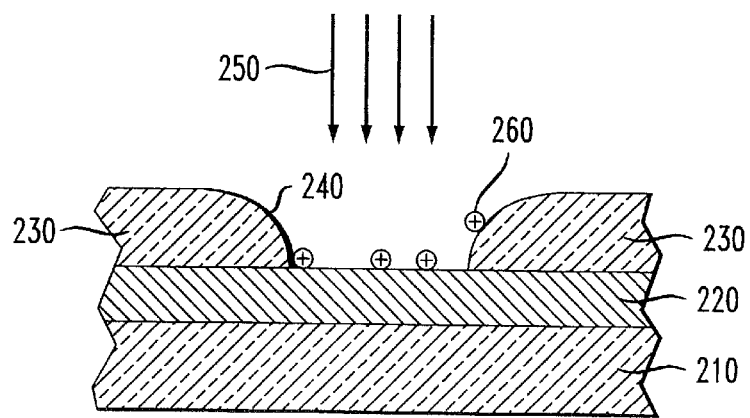
FIG. 2 illustrates a cross-sectional view of an exemplary portion of the semiconductor discussed above subjected to a RF back-sputtering process.

Turning now to FIG. 2, illustrated is a cross-sectional view of an exemplary portion of the semiconductor 100 discussed above subjected to a RF back-sputtering process. A dielectric layer 210 is depicted with a metal stack 220 deposited across the dielectric layer 210. The dielectric layer 210 is also known as an intermetal dielectric if the dielectric layer is located between metal stacks or a polysilicon/metal dielectric (PMD) if the dielectric layer is located between the substrate and the first metal layer. A second dielectric layer 230 is shown deposited across the metal stack 220 with a contact opening or via 240, depending on whether the opening is in the PMD or the intermetal dielectric layers. Contaminants, (one of which is designated as 260) such as sodium oxides ($Na_2O$), silicon oxides ($SiO_2$), or other by-products from previous processes, are depicted residing in the via 240. The metal stack 220 material, e.g., aluminum, may also contribute to the contaminants residing in the via 240 in the form of oxidized aluminum ($Al_2O_3$). These contaminants, if not removed, will increase the chain $R_c$ between the metal layer 220 and another metal layer (not shown) that will be deposited in the via 240. With MOS technologies larger than 0.5 μm, prior to the deposition of additional metal stacks, a common contaminant removal method was to subject the semiconductor 100 to a relatively low power RF back-sputtering process. The RF back-sputtering process, discussed previously, is illustrated by directed lines (one of which is designated 250) for ease of explanation. Currently, with MOS technologies in the 0.5 μm range and the accompanying increase in the aspect ratios of the contact openings and vias, the low power RF back-sputtering process effectiveness in removing contaminants has been substantially reduced. To compensate for the larger aspect ratio of the contact openings and vias, the power level has substantially increased to higher RF powers, such as those around 500 W. As previously mentioned, the increase in power has been accompanied with a corresponding increase in potential plasma damage to the semiconductor, in particular, the gate oxides.

To remedy the foregoing problem, the present method provides, in an advantageous embodiment, a getter layer that allows a lower wattage of power to be used, but at the same time, provides an effective method for cleaning or removing any contaminants or impurities from the contact opening or via. This particular aspect of the present invention will now be discussed in detail.

Figure 3:
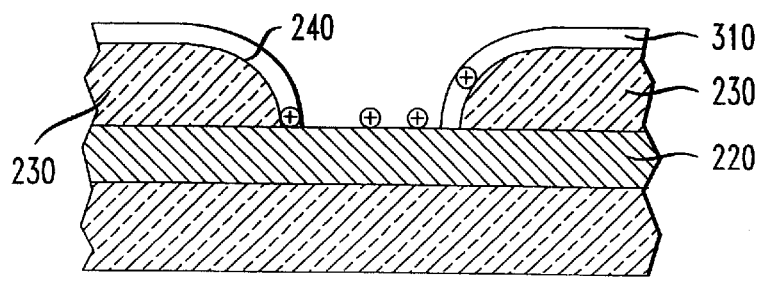
FIG. 3 illustrates a cross-sectional view of an exemplary portion of a semiconductor with a getter layer.

Turning now to FIG. 3, there is illustrated a cross-sectional view of an exemplary portion of the semiconductor 100 with a getter layer. The cross-sectional view illustrated in FIG. 3 is analogous to the cross-sectional view of the semiconductor 100 depicted in FIG. 2 except that a getter layer 310 has been deposited on the second dielectric layer 230 and the metal stack 220. The getter layer 310 is typically deposited using a sputtering process, e.g., magnetron, DC/RF and triode sputtering. In advantageous embodiments, the getter layer 310 has a higher affinity for oxygen than the material used to form the metal stack 220 or has a greater or higher capability to getter other non-oxide contaminants from the metal stack 220. In other words, the getter layer 310 binds more readily with the contaminants than does the metal stack 220. In one particular embodiment, the material used to form the getter layer 310 is typically titanium. However, other materials that have a higher affinity for oxygen than the material used to form the metal stack 220, such as those elements found in Groups IV or V, such as titanium, zirconium, hafnium, vanadium, niobium, or tantalum or has an ability to getter other non-oxide contaminants from the metal stack 220 may also be used. In an advantageous embodiment, the getter layer 310 is deposited at a temperature of about 375° at approximately 3.0 milli-Torr of pressure with the total argon flow rate of about 40 standard cubic centimeters per minute. The argon flow rate could also be comprised of a module argon flow rate of about 28 standard cubic centimeters per minute with a backside argon flow rate of about 12 standard cubic centimeters per minute. Additionally, in an advantageous embodiment, the thickness of the getter layer 310 deposited may range from about 6 nm to approximately 15 nm and more specifically from about 6 nm to about 12 nm. While all of these parameters are directed to an advantageous embodiment, it should be understood that they may vary from one application to another and still be effective in effectively cleaning the device prior to the deposition of the metal stack. Therefore, the present invention should not be limited to these specific process parameters.

As described above, the material typically used to form the getter layer 310 has a higher affinity for oxygen than the material used to form the metal stack 220 or has an ability to getter other non-oxide contaminants from the metal stack 220. Accordingly, it is believed that the getter layer 310 material reduces the metal oxides or other non-oxide contaminants that are present at the surface of the metal stack 220 by reacting with the oxygen atoms or getting the other contaminants and leaving the base metal element in the metal stack 220 surface substantially oxide and contaminant free. The gettering mechanism is not necessarily understood, but it is observed that the contaminants bind in some way with the getter layer 310 such that they no longer contaminate the metal stack 220.

In an advantageous embodiment, the getter layer 310 is comprised of titanium. However as previously stated other metals such as those listed above. It is believed that titanium is a highly reactive element that readily reacts with the oxygen atoms on the surface of the metal stack 220 metal (typically aluminum) to form titanium oxide.

Figure 4:
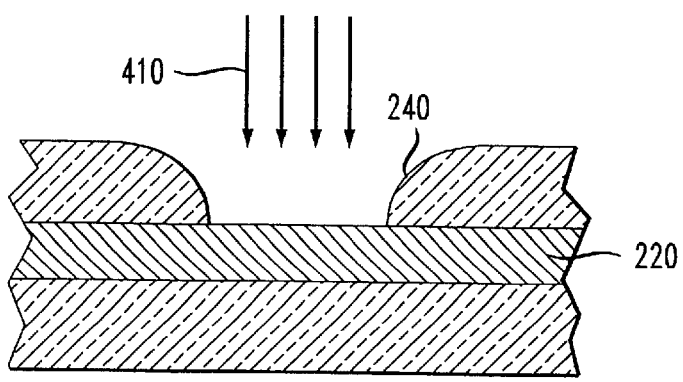
FIG. 4 illustrates a portion of the semiconductor depicted in FIGS. 2 and 3 subjected to a RF back-sputtering process.

Turning now to FIG. 4, illustrated is a portion of the semiconductor 100 depicted in FIGS. 2 and 3 subjected to a RF back-sputtering process. After the getter layer 310 has been deposited as described above, the resultant semiconductor is exposed to a relatively low RF power in a back-sputtering process. In an advantageous embodiment, the RF power is about 250 watts. The low power RF back-sputtering process is used to remove at least a portion, if not all or a substantial portion, of the getter layer 310 along with the residual oxides or contaminants. The metal stack 220 exposed at the bottom of the via 240 after the back-sputtering process is substantially "clean", i.e., free of oxides or other contaminants, and is ready for the deposition of a second metal stack. In an alternative embodiment, the semiconductor device 110 may be subjected to the lower power RF sputtering process prior to, as well as after the deposition of the getter layer 310.

Figure 5:
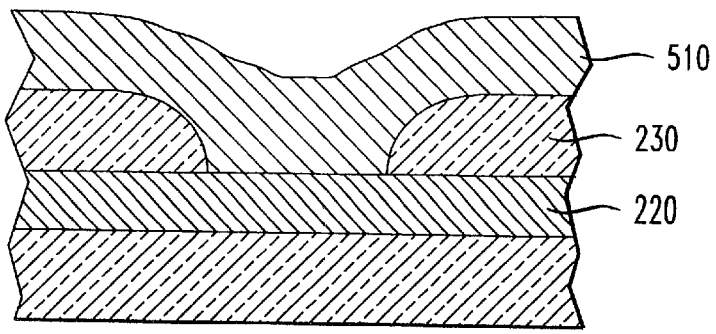
FIG. 5 illustrates a portion of the semiconductor depicted in FIGS. 2, 3 and 4 with a second metal stack.

Turning now to FIG. 5, illustrated is a portion of the semiconductor device 110 depicted in FIGS. 2, 3 and 4 with a second metal stack 510. The second metal stack (M2) 510 is formed using conventional processes, such as sputtering, over the first metal stack 220 and the second dielectric layer 230. The advantages of using a getter layer prior to the application of the RF back-sputtering process to substantially lower the chain $R_c$ of the metal stacks is further illustrated by referring to FIG. 6.

Figure 6:
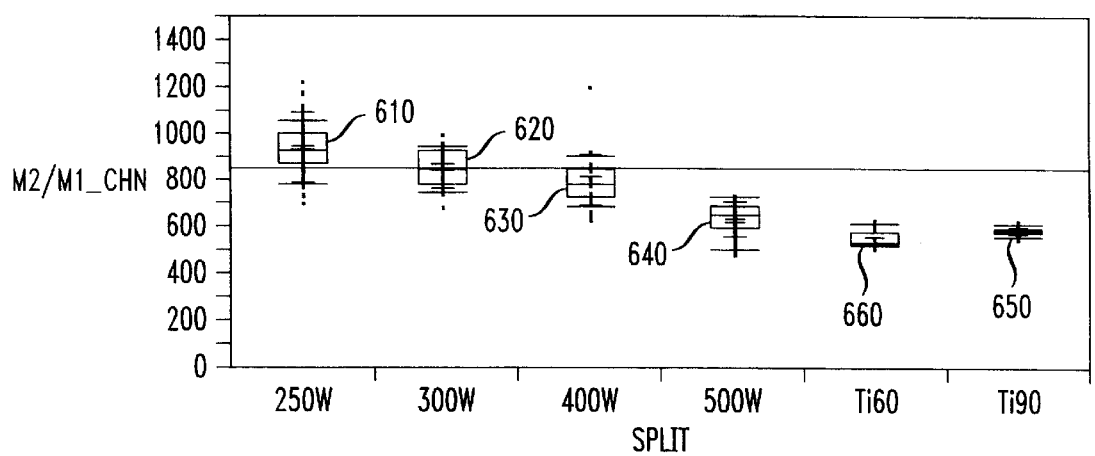
FIG. 6 illustrates the results of experiments comparing the $R_c$ of the metal stacks.

Turning now to FIG. 6, illustrated are the results of experiments comparing the chain resistance ($R_c$) of metal stacks. The results are illustrated in box plot graphs designated 610, 620, 630, 640, 650 and 660. Graphs 610, 620, 630 and 640 share the common factor that the getter layer was not employed in these particular examples. However, a RF back-sputtering process was used to clean the device prior to the deposition of the metal stack. Graphs 650 and 660 share the common factors that the getter layer was used in these particular examples and that a RF back-sputtering process was used to clean the device prior to the deposition of the getter layer and to substantially remove the getter layer after its deposition. The first box plot graph 610 illustrates the $R_c$ values obtained for a second metal stack (M2) after a 250 W RF back-sputtering process. The second, third and fourth graphs 620, 630, 640 also illustrate the $R_c$ values obtained for M2/M1 stacks when the getter layer was not employed and using RF back-sputtering processes with power levels of 300 W, 400 W and 500 W, respectively. The fifth graph 650 illustrates the $R_c$ values obtained after a 250 W back-sputtering process was used to substantially remove a 60 Å thick getter layer. As stated above, the back-sputtering was conducted prior to the deposition of the getter layer, and it was also used to substantially remove getter layer. As explained below, the prior back-sputtering step is optional in the present invention and a reduction in resistance can be achieved without using the prior back-sputtering step. The sixth graph 660 illustrates the $R_c$ values obtained after a 250 W back-sputtering process was used to substantially remove a 90 Å thick getter layer in the same manner as used for the fifth graph.

Experimental results are further summarized in Table 1.

TABLE 1

Experimental Results

| Experiment | Technology ($\mu$m) | Mean (ohms) | Standard Deviation (ohms) |
|---|---|---|---|
| 250 W/M2 (std) | 0.5 | 928 | 148 |
| 300 W/M2 | 0.5 | 828 | 91 |
| 400 W/M2 | 0.5 | 758 | 125 |
| 500 W/M2 | 0.5 | 620 | 68 |
| 250 W/60 Å/250 W/M2 | 0.5 | 568 | 32 |
| 250 W/90 Å/250 W/M2 | 0.5 | 606 | 32 |
| 250 W/M2 (std) | 0.35 | 1453 | 294 |
| 250 W/M2 (425° C.) | 0.35 | 1027 | 80 |
| 500 W/M2 | 0.35 | 739 | 58 |
| 250 W/250 W/M2 | 0.35 | 1224 | 451 |
| 60 Å/250 W/M2 | 0.35 | 646 | 124 |

TABLE 1-continued

Experimental Results

| Experiment | Technology (μm) | Mean (ohms) | Standard Deviation (ohms) |
|---|---|---|---|
| 250 W/60 Å/ 250 W/M2 | 0.35 | 738 | 32 |
| 250 W/120 Å/ 250 W/M2 | 0.35 | 732 | 27 |

Table 1 also includes results of experiments conducted on semiconductors fabricated with 0.35 μm CMOS process technology. From above, it is clearly demonstrated that the use of the getter layer as disclosed in this invention substantially lowers the contact resistance (mean value of 606 ohms as opposed to 928 ohms) and results in a much tighter distribution (standard deviation of 32 ohms as opposed to 148 ohms). Furthermore, the resultant $R_c$ produced with a 250 W RF back-sputtering process and a getter layer disclosed in the present invention is lower than the $R_c$ resulting from a 500 W RF back-sputtering process without the use of a getter layer.

Figure 7:
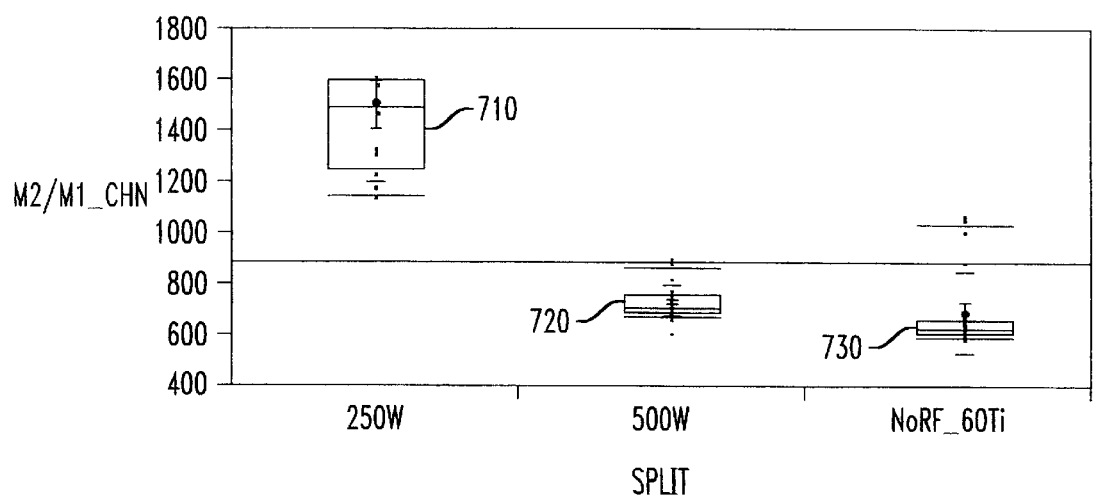
FIG. 7 illustrates the results of experiments comparing the $R_c$ of the metal stacks when no preliminary RF sputtering is conducted.

Turning now to FIG. 7, illustrated are the results of experiments comparing the chain $R_c$ of metal stacks in the process where a RF sputtering process is conducted prior to the formation of the getter layer. A first box plot graph 710 illustrates the $R_C$ values obtained for a second metal stack (M2) after a 250 W RF back-sputtering process was used to clean the device prior to the deposition of the metal stack. However, the getter layer was not used in this example. A second box plot graph 720 illustrates the $R_c$ values obtained for M2/M1 stacks when the getter layer was not used, and a RF back-sputtering processes with power levels of 500 W was used to clean the device in the same manner as the first box plot example. A third box plot graph 730 illustrates the $R_c$ values obtained after a 250 W back-sputtering process was used to substantially removed a 60 Å thick getter layer. In this particular example, the prior back-sputtering step was not conducted prior to the deposition of the getter layer. However the back-sputtering process was used to substantially removed the getter layer.

Based on the comparison of FIGS. 6 and 7, it can be deduced that the presence of the getter layer and the removal of the getter layer with a low power RF back-sputtering process reduces the $R_c$ for the metal stack, even when the prior back-sputtering step is not conducted.

From the above, it is apparent that the present invention provides a method of using a getter layer on a semiconductor substrate having a first metal stack formed thereon to improve metal to metal contact resistance. The method comprises the steps of forming a getter layer on the first metal stack, wherein the getter layer has a higher affinity for oxygen or gettering capability than the first metal stack, removing at least a portion of the getter layer by exposing the getter layer to radiation, and forming a second metal stack on the first metal stack.

The step of forming the getter layer includes the step of sputtering the getter layer onto the first metal stack and the step of removing at least a portion of the getter layer includes the step of removing the getter layer with a radio frequency (RF) source. The wattage of the radio frequency (RF) source does not exceed about 250 watts. As previously explained, this reduces the plasma damage to the semiconductor devices and provides for a substantially lower contact resistance over the presently employed methods.

The foregoing has outlined, rather broadly, preferred and alternative features of the present invention so that those skilled in the art may better understand the detailed description of the invention as stated herein. Moreover, those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

What is claimed is:

1. A method of using a getter layer on a semiconductor substrate having a first metal stack formed thereon, said method comprising the steps of:

forming a getter layer on said first metal stack, said getter layer having a higher affinity for oxygen or a higher getter capability than said first metal stack;

removing at least a portion of said getter layer by exposing said getter layer to radiation; and forming a second metal stack on said first metal stack.

2. The method as recited in claim 1 wherein said getter layer comprises titanium.

3. The method as recited in claim 1 wherein said step of forming said getter layer includes the step of sputtering said getter layer onto said first metal stack.

4. The method as recited in claim 1 wherein said step of substantially removing includes the step of removing said getter layer with a radio frequency (RF) source.

5. The method as recited in claim 4 wherein a wattage of said radio frequency (RF) source does not exceed about 250 watts.

6. The method as recited in claim 1 wherein said second metal stack comprises titanium.

7. The method as recited in claim 1 wherein said step of forming said getter layer includes the step of said getter layer binding with impurities located on said first metal stack.

8. The method as recited in claim 7 wherein said step of binding includes the step of said getter layer binding with oxide or non-oxide contaminants.

9. The method as recited in claim 1 wherein a dielectric layer having an opening formed therein is formed over said first metal stack and said step of forming said getter layer includes the step of forming said getter layer within said opening to contact said first metal stack.

10. The method as recited in claim 1 wherein said step of forming said getter layer includes the step of forming said getter layer to a thickness ranging from about 6 nm to about 12 nm.

11. The method as recited in claim 1 wherein said step of forming said getter layer includes forming said getter layer at a temperature of about 375° C. and 3.0 milliTorr of pressure with a total argon flow rate of about 40 standard cubic centimeters per minute.

12. The method as recited in claim 11 wherein said argon flow rate comprises a module argon flow rate of about 28 standard cubic centimeters per minute and a backside argon flow rate of about 12 standard cubic centimeters per minute.

* * * * *